(12) United States Patent
Schmid et al.

(10) Patent No.: US 8,980,751 B2
(45) Date of Patent: Mar. 17, 2015

(54) METHODS AND SYSTEMS OF MATERIAL REMOVAL AND PATTERN TRANSFER

(75) Inventors: Gerard M. Schmid, Austin, TX (US); Michael N. Miller, Austin, TX (US); Byung-Jin Choi, Austin, TX (US); Douglas J. Resnick, Leander, TX (US); Sidlgata V. Sreenivasan, Austin, TX (US); Frank Y. Xu, Round Rock, TX (US); Darren D. Donaldson, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 281 days.

(21) Appl. No.: 13/014,508

(22) Filed: Jan. 26, 2011

(65) Prior Publication Data
US 2011/0183521 A1 Jul. 28, 2011

Related U.S. Application Data

(60) Provisional application No. 61/298,734, filed on Jan. 27, 2010, provisional application No. 61/299,097, filed on Jan. 28, 2010.

(51) Int. Cl.
| | |
|---|---|
| *H01L 21/311* | (2006.01) |
| *H01J 37/20* | (2006.01) |
| *G03F 7/42* | (2006.01) |
| *B82Y 40/00* | (2011.01) |
| *B82Y 10/00* | (2011.01) |
| *G03F 7/00* | (2006.01) |

(52) U.S. Cl.
CPC ............. *G03F 7/0002* (2013.01); *G03F 7/42* (2013.01); *B82Y 40/00* (2013.01); *B82Y 10/00* (2013.01)

USPC ................. 438/694; 250/432 R; 257/E21.249

(58) Field of Classification Search
CPC .............................. B82Y 10/00; G03F 7/0002
USPC ................. 438/654; 250/432 R; 257/E21.249
See application file for complete search history.

(56) References Cited

U.S. PATENT DOCUMENTS

| | | | |
|---|---|---|---|
| 6,873,087 | B1 | 3/2005 | Choi et al. |
| 6,932,934 | B2 | 8/2005 | Choi et al. |
| 6,936,194 | B2 | 8/2005 | Watts |
| 7,077,992 | B2 | 7/2006 | Sreenivasan et al. |
| 7,157,036 | B2 | 1/2007 | Choi et al. |

(Continued)

FOREIGN PATENT DOCUMENTS

| | | |
|---|---|---|
| DE | 4113523 | 10/1992 |
| DE | 19957034 A1 | 6/2001 |

(Continued)

OTHER PUBLICATIONS

SG 201204190-1 Search Report and Written Opinion, IP Office of Singapore, Mar. 25, 2013, pp. 1-12.

(Continued)

*Primary Examiner* — Duy Deo
*Assistant Examiner* — Mahmoud Dahimene
(74) *Attorney, Agent, or Firm* — Cameron A. King (57) ABSTRACT

Polymerized material on a substrate may be removed by exposure to vacuum ultraviolet (VUV) radiation from an energy source within a gaseous atmosphere of a controlled composition. Following such removal, additional etching techniques are also described for nano-imprinting.

22 Claims, 10 Drawing Sheets

(56) References Cited

U.S. PATENT DOCUMENTS

| | | |
|---|---|---|
| 7,179,396 B2 | 2/2007 | Sreenivasan |
| 7,396,475 B2 | 7/2008 | Sreenivasan |
| 2003/0215751 A1 | 11/2003 | Otake et al. |
| 2004/0065252 A1 | 4/2004 | Sreenivasan et al. |
| 2004/0065976 A1 | 4/2004 | Sreenivasan et al. |
| 2005/0187339 A1 | 8/2005 | Xu et al. |
| 2006/0040474 A1 | 2/2006 | Shieh et al. |
| 2006/0046470 A1* | 3/2006 | Becknell et al. ............... 438/637 |
| 2006/0141778 A1* | 6/2006 | Tonegawa et al. ............ 438/638 |
| 2007/0138405 A1* | 6/2007 | Shirck et al. .................. 250/426 |
| 2008/0081154 A1 | 4/2008 | Kaneda et al. |
| 2008/0131623 A1 | 6/2008 | Zhang et al. |
| 2008/0302400 A1 | 12/2008 | Johnston et al. |
| 2009/0032997 A1 | 2/2009 | Hiratsuka |
| 2009/0308841 A1 | 12/2009 | Wakamatsu |

FOREIGN PATENT DOCUMENTS

| | | |
|---|---|---|
| EP | 0510503 A2 | 10/1992 |
| EP | 0771638 A2 | 5/1997 |
| JP | 2000-216128 | 8/2000 |
| JP | 2003-337432 | 11/2003 |
| JP | 2008-91685 | 4/2008 |
| JP | 2009-34926 | 2/2009 |
| JP | 2009-298068 | 12/2009 |
| WO | WO/2005/026837 A2 | 9/2003 |
| WO | WO-2008/045520 | 4/2008 |
| WO | WO/2010/039196 | 4/2010 |

OTHER PUBLICATIONS

ESPACE Abstract of JP2000-216128, EPO Espacenet.com (Aug. 4, 2000).

* cited by examiner

METHODS AND SYSTEMS OF MATERIAL REMOVAL AND PATTERN TRANSFER

CROSS-REFERENCE TO RELATED PATENT APPLICATIONS

The present application claims priority to U.S. Ser. No. 61/298,734 filed Jan. 27, 2010, and to U.S. Ser. No. 61/299,097 filed Jan. 28, 2010, both of which are hereby incorporated by reference in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

In many cases, the solidified layer forms a residual layer over portions of the substrate that must be removed prior to subsequent processing, which may include transferring the relief image into the substrate.

SUMMARY

Methods and systems are provided for removing solidified polymerizable material on a substrate and for transferring a pattern on a hard mask layer or a substrate.

In one aspect, the methods include forming a patterned layer having a residual layer on least a portion of substrate and positioning said substrate such that a portion of the substrate with the residual layer is in alignment with a provided vacuum ultraviolet (VUV) radiation source. A gas composition of less than 21% oxygen is provided between the portion of the substrate and the vacuum ultraviolet (VUV) radiation source. The substrate is irradiated with vacuum ultraviolet (VUV) radiation to remove the residual layer. In one aspect, the provided gas composition is less than 21% oxygen. In other aspects, the provided gas composition is less than 10% oxygen or less than 5% oxygen. In yet another aspect the vacuum ultraviolet (VUV) radiation is enclosed within a chamber having an exposure aperture and the provided gas composition is provided to the chamber.

In other aspects, systems include a vacuum ultraviolet (VUV) radiation source, a substrate handler configured to retain a substrate and positioned opposite and moveable relative to the vacuum ultraviolet (VUV) radiation, and two or more reservoirs each configured to retain a gas and locally provide the gas between said vacuum ultraviolet (VUV) radiation source and said substrate. A control unit is connected to the reservoirs, and programmed to control an amount of gas delivered from each reservoir so as to provide a specified mixture of gases between said vacuum ultraviolet (VUV) radiation source and said substrate. In another aspect the vacuum ultraviolet (VUV) radiation is enclosed within a chamber having an exposure aperture and the provided gas composition is provided to the chamber. In a further aspect the exposure aperture allows for fluid communication between the chamber and substrate handler.

In various aspects, the vacuum ultraviolet (VUV) radiation can be provided at 140-190 nm wavelength. In other aspects, the vacuum ultraviolet (VUV) radiation can be provided with a peak intensity of approximately 172 nm and a spectral bandwidth of approximately 15 nm FWHM.

Further aspects include transferring a pattern following material removal. In one aspect, a pattern is transferred to a hard mask using a batch process step to remove portions of the hard mask. In a further aspect, the batch processing uses hydrofluoric acid. In other aspects, the patterned layer can be removed, and the pattern transferred to the substrate using a batch process step to remove portions of said substrate. In further aspects wherein the substrate is silicon and the hard mask is silicon oxide, potassium hydroxide may be used in such batch processing.

Aspects and implementations described herein may be combined in ways other than described above. Other aspects, features, and advantages will be apparent from the following detailed description, the drawings, and the claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
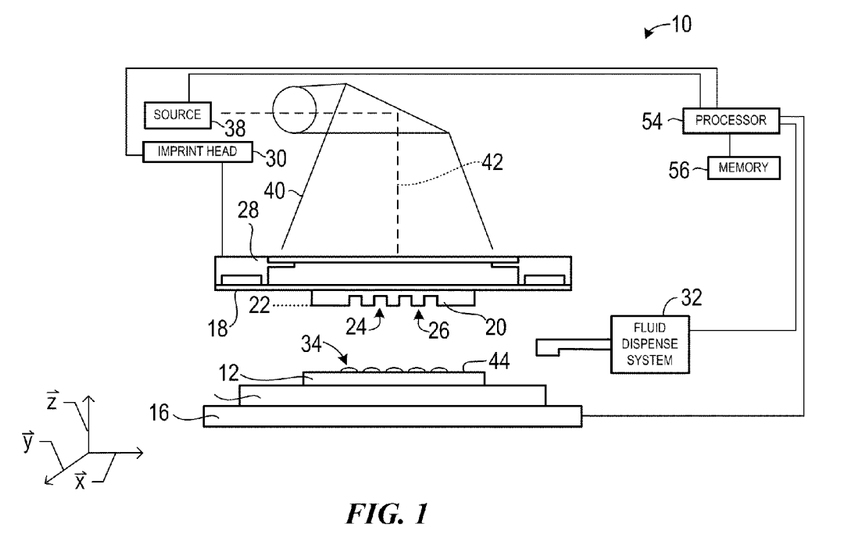
FIG. 1 illustrates a simplified side view of a lithographic system.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12.

Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
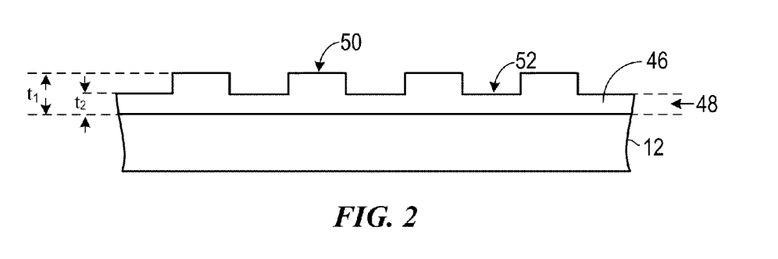
FIG. 2 illustrates a simplified side view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. Nos. 6,932,934, 7,077,992, 7,179,396, and 7,396,475, all of which are hereby incorporated by reference in their entirety.

During the imprinting process, as described above, the distance between template 18 and substrate 12 is reduced and polymerizable material 34 flows to conform to topography of template 18 and substrate 12. When template 18 and substrate are within a minimal distance of one another, the flow channel between them may be very narrow reducing flow of polymerizable material 34. Techniques may be implemented to increase the flow rate. For example, polymerizable material 34 may include the use of low viscosity materials (e.g., materials having a viscosity less than approximately 10 centipoise). By using low viscosity material, the flow channel between template 18 and substrate 12 may be 25 nm or smaller.

Thickness of the flow channel directly forms residual layer 48. As such, residual layer 48 generally includes a non-zero thickness $t_2$. Many applications, however, provide for the removal of residual layer 48 from patterned layer 46 so that substrate 12 may be accessible between features 50 and 52.

The most common method for removing residual layer 48 from patterned layer 46 includes a plasma-based etching process. Such processes may be capable of directional (i.e., primarily vertical) etching of solidified polymerizable material 34, such that residual layer 48 may be removed with minimal alterations to the lateral dimensions of features 50 and 52. Plasma-based etching processes, however, may not be suitable for all application due to factors including high cost, low throughput, and the need for a reduced pressure environment.

Similarly, in nanopatterning applications, in particular such as the formation of photovoltaic devices including solar cells and/or photonic crystal arrays and the like, cost of ownership becomes a driving factor in production. Typically, with nanopatterns the patterns are transferred using dry etching equipment and processes. These processes, however, are costly and have low throughput. For example, processes such as reactive ion etchers (RIE), ion milling, etc, and the like, generally employ the use of a gas phase, and as such, time must be allocated for pumping down to a vacuum pressure and then bringing the pressure back to atmospheric pressure.

Large facilitized pieces of equipment employing large vacuum pumps that require specialized process gasses and utilize customized power supplies increase costs and scalability. The tools are generally limited by substrate size such that only substrates of a certain size may be etched. For example, many RIE tools are able to process 8" round or smaller substrates, but are not able to handle larger sized or square substrates. Tools may be also limited to serial processing of substrates (i.e., one at a time). Though batch processing has been demonstrated for certain dry processes (e.g., resist stripping in down-stream ashers/bulk resist strip ashers), pattern transfer processes are performed in specially designed etch chambers with particular electrode configurations. These chambers are sensitive to surface contamination and require periodic maintenance that increase fabrication costs.

Described herein are alternative removal systems and techniques for removing solidified polymerizable material 34. For example, the systems and techniques described herein may be used for removing residual layer 48 from patterned layer 46. Compared to plasma etching techniques, the removal techniques described herein provide higher throughput and reduced cost and do not require a reduced pressure processing environment. Additionally, removal techniques described herein are applicable for removing underlying organic layers formed by non-imprint methods. Also described herein are etching techniques particularly useful in nanopatterning applications that are aimed at reducing cost, increasing throughput and providing simple scaled pattern transfer process steps as compared to the processes described above. Such etching techniques can be used alone or in combination with the above material removal techniques.

Figure 3:
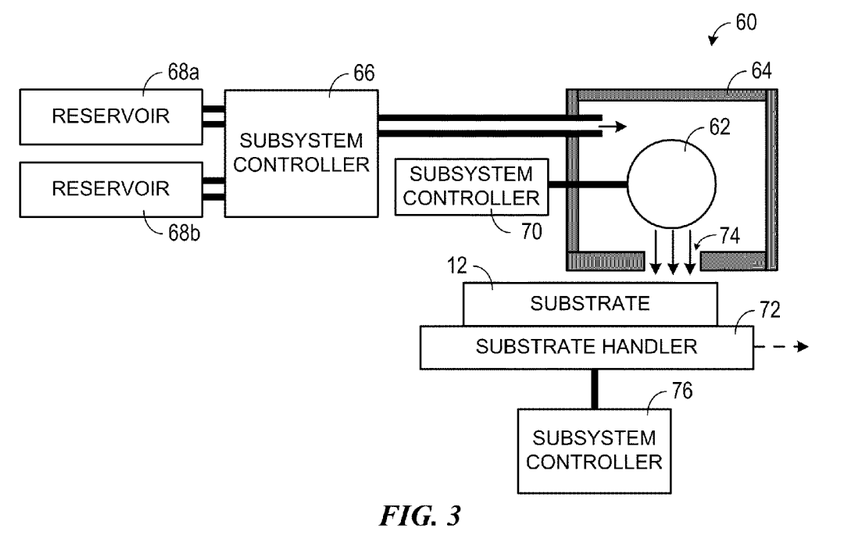
FIG. 3 illustrates a block diagram of an exemplary system for removing solidified polymerizable material in accordance with the present invention.

FIG. 3 illustrates an exemplary system 60 for removal of solidified polymerizable material 34. System 60 may include a radiation source 62. Radiation source 62 may comprise a vacuum ultraviolet (VUV) region of the solar spectrum. For example, radiation source 62 may comprise a range of approximately 140 nm to 190 nm wavelength. In one embodiment, radiation may be provided by a Xe excimer dielectric barrier discharge lamp. The lamp may have peak intensity at a wavelength of approximately 172 nm, with a spectral bandwidth of approximately 15 nm FWHM. Intensity of radiation at the surface of residual layer 48 is approximately 5 to 150 mW/cm$^2$.

Radiation source 62 may be enclosed within a chamber 64. A composition of gas may be present inside chamber 64. The particular gas composition or mixture composition may depend on the particular substrate. For example, as further described herein, an oxygen-reduced environment improves material removal overall, but it may be desirable in certain applications to maintain some percentage of oxygen, such as in the case of removing substrate fluorocarbons. For example, in one embodiment the composition of gas may consist of at least 90 percent nitrogen and less than 10 percent oxygen. In another embodiment, the composition of gas may consist of 95 percent nitrogen and less than 5 percent oxygen.

The composition or mixture of gas may be controlled by a first subsystem controller or control unit 66 connected to reservoirs 68a and 68b, as depicted in FIG. 3. First subsystem controller 66 may provide for the flow of gas from reservoirs 68a and 68b to chamber 64, and may be programmed to control the amount of gas delivered from each reservoir so as to provide a specified gas composition or mixture to chamber 64.

Radiation output of radiation source 62 may be controlled by second subsystem controller or control unit 70. For example, removal rate of residual layer 48 may be adjusted by second subsystem controller 70 modifying intensity of radiation source 62.

System 60 may include a substrate handler 72. Substrate handler 72 may provide scanning of substrate 12 by an exposure aperture 74 of chamber 64. Movement of substrate handler 72 may be controlled by a third subsystem controller 76. For example, removal rate of solidified polymerizable material 34 on substrate 12 may be adjusted by third subsystem controller 76 modifying linear speed of substrate handler 72.

In one embodiment, substrate handler 72 may include a substrate chuck and a linear actuator. Substrate chuck and linear actuator are constructed to scan substrate beneath exposure aperture 74 of chamber 64. In another embodiment, substrate handler 72 may include a plurality of rotating rollers capable of actuating substrate 12 beneath exposure aperture 74 of chamber 64.

It should be noted that first subsystem 66, second subsystem 70 and/or third subsystem 76 may be integral to each other. Alternatively, first subsystem 66, second subsystem 70, and/or third subsystem 76 may be separate systems.

Figure 4:
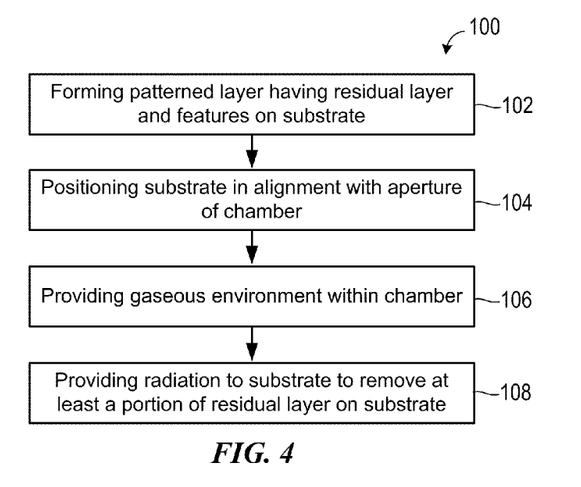
FIG. 4 illustrates a flow chart of an exemplary method for removing solidified polymerizable material.

FIG. 4 illustrates an exemplary method 100 for removal of residual layer 48 from patterned layer 46 positioned on substrate 12. In a step 102, patterned layer 46 having residual layer 48 and features 50 and 52 may be formed on substrate 12 using system and methods described in relation to FIGS. 1 and 2. In a step 104, subsystem controller 76 may position substrate 12 in alignment with aperture 74 of chamber 64. In a step 106, subsystem controller 66 may provide a gaseous environment within chamber 64. In a step 108, subsystem 70 may provide radiation (e.g., VUV radiation) to substrate 12 through aperture 74 of chamber 64. For example, subsystem 70 may control radiation source 62 to provide vacuum ultraviolet radiation with peak intensity of approximately 172 nm, having a spectral bandwidth of approximately 15 nm FWHM.

Figure 5:
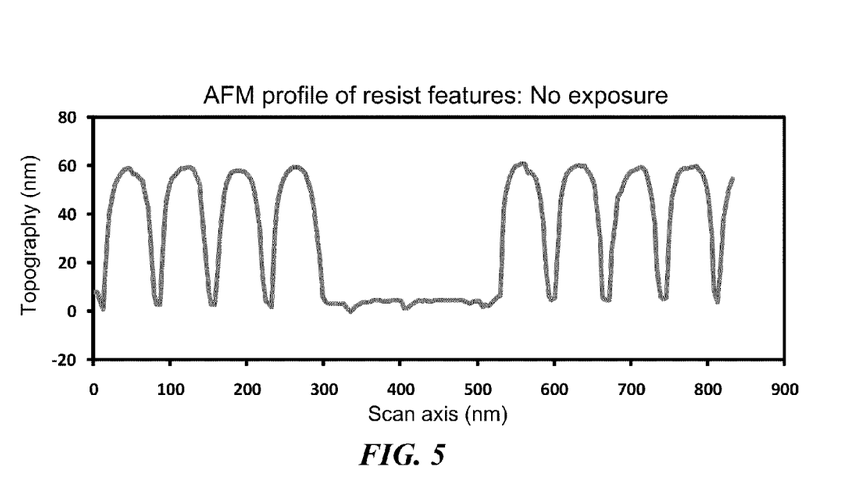
FIG. 5 illustrates an atomic force microscopy (AFM) profile of 40 nm half-pitch resist features prior to radiation exposure.
Figure 6:
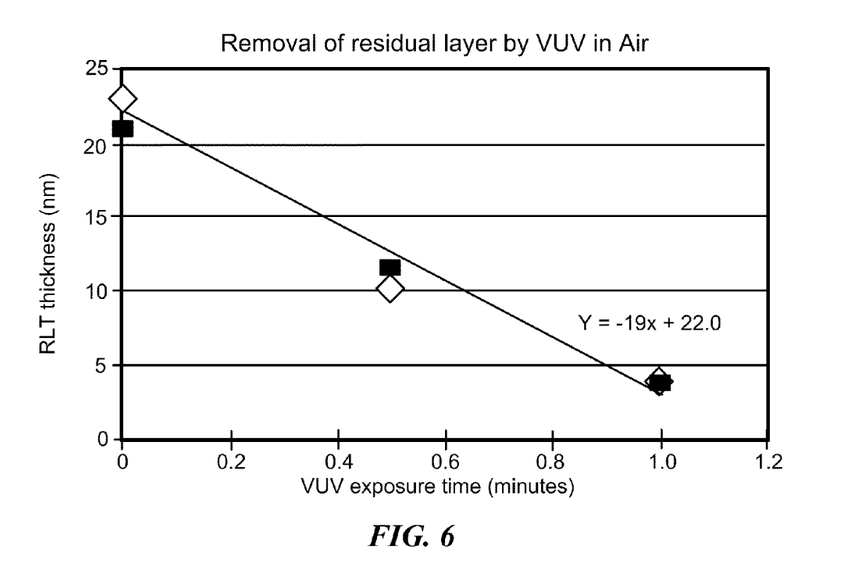
FIG. 6 illustrates a graphical representation of rate of removal of a residual layer by radiation exposure (VUV) in air.
Figure 7:
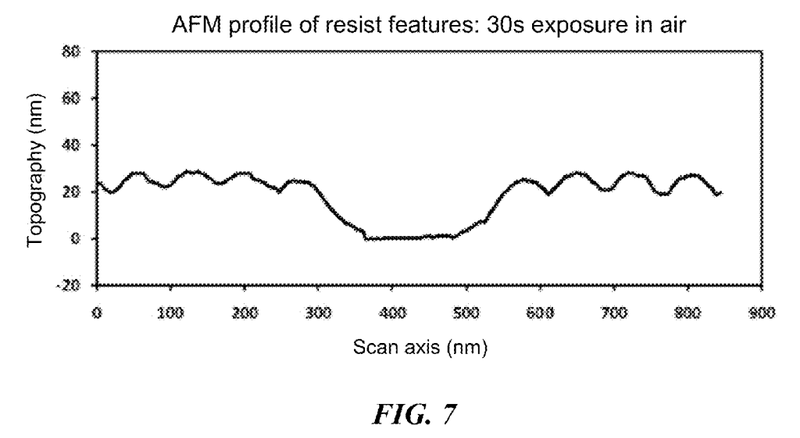
FIG. 7 illustrates a AFM profile of 40 nm half-pitch resist features after 30 seconds of radiation exposure (VUV) in air.
Figure 8:
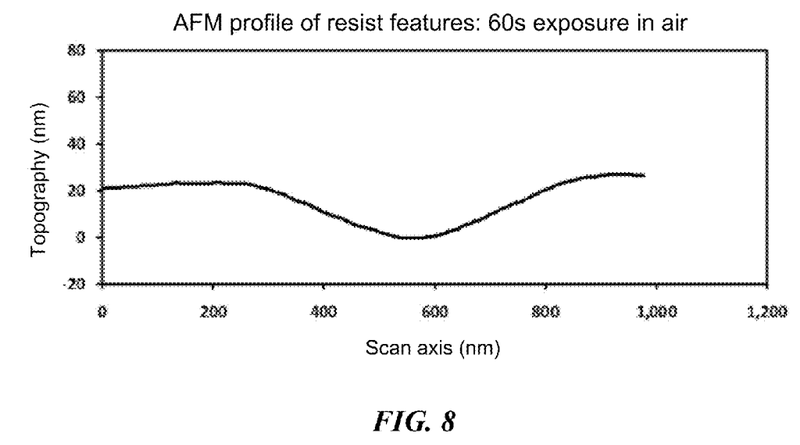
FIG. 8 illustrates a AFM profile of 40 nm half-pitch resist features after 60 seconds of radiation exposure (VUV) in air.

The type of gaseous environment within chamber 64 provides a substantial increase in quality of features 50 and 52 remaining after removal of residual layer 48. For example, FIG. 5 illustrates a profile of exemplary resist features 50 and 52 measured by atomic force microscopy prior to exposure to radiation. Upon radiation exposure (e.g., VUV radiation) of patterned layer 46 in an air environment (approximately 79% nitrogen and 21% oxygen), residual layer 48 may be removed at a rate of approximately 19 nm/min as shown in FIG. 6. The features 50 and 52 of patterned layer 46, however, may be severely degraded such that the pattern is almost completely degraded after 60 seconds of exposure in air as shown in FIGS. 7 and 8 (illustrating exposure at 30 seconds in air in FIG. 7 and exposure at 60 seconds in air in FIG. 8).

Figure 9:
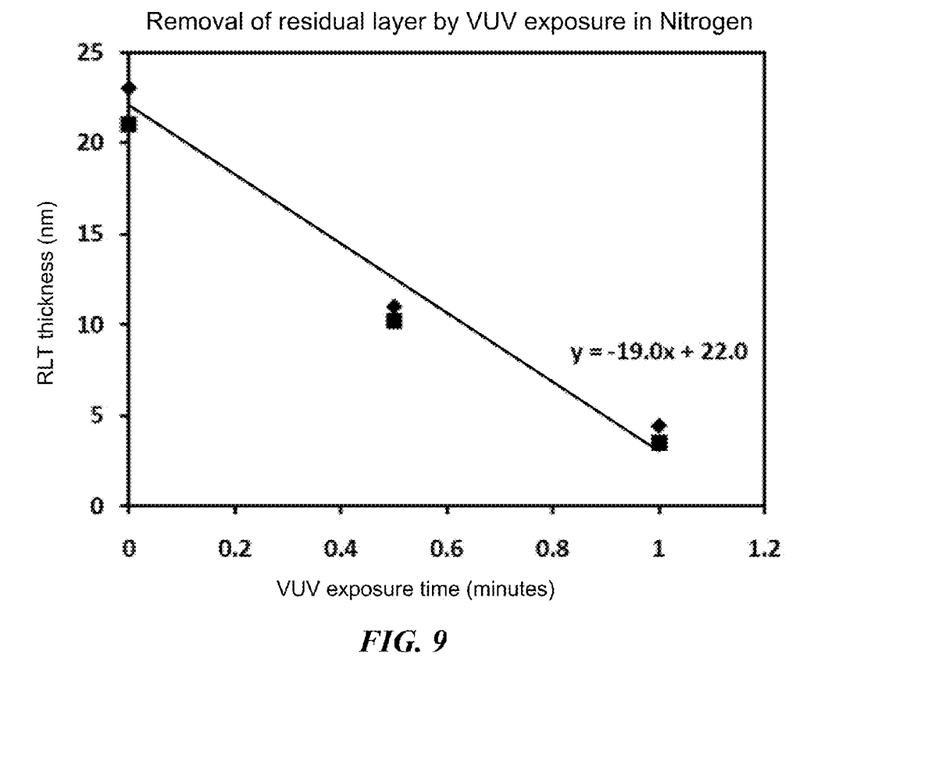
FIG. 9 illustrates a graphical representation of rate of removal of a residual layer by radiation exposure (VUV) in a reduced-oxygen environment.
Figure 10:
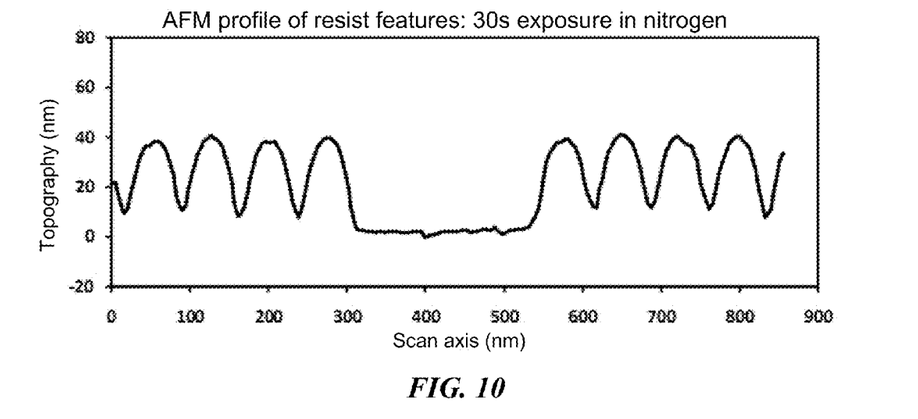
FIG. 10 illustrates a AFM profile of 40 nm half-pitch resist features after 30 seconds of radiation exposure (VUV) in a reduced-oxygen environment.
Figure 11:
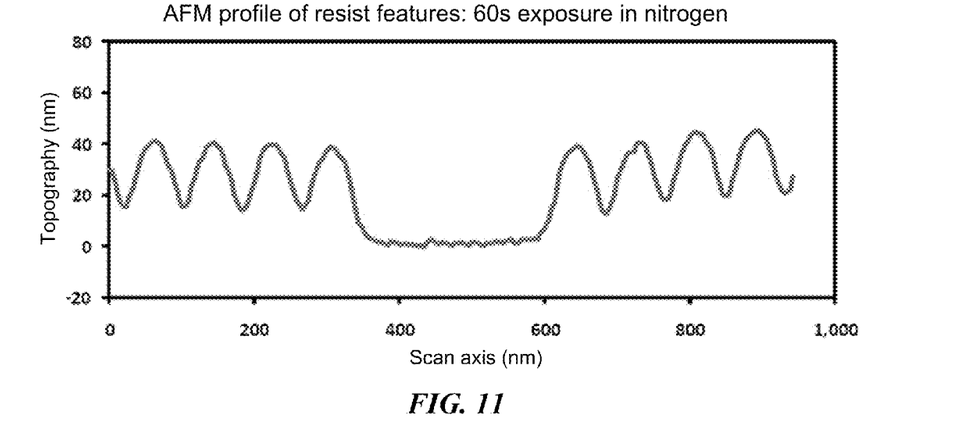
FIG. 11 illustrates an AFM profile of 40 nm half-pitch resist features after 60 seconds of radiation exposure (VUV) in a reduced-oxygen environment.

In providing the exposure process in a nitrogen-enriched environment, in which the amount of available oxygen relative air has thus been reduced, the removal of residual layer 48 may be substantially similar to results seen in air environment, however, quality of features 50 and 52 may be substantially retained during the process as shown in FIGS. 9-11. For example, increasing the air environment to provide approximately 98% nitrogen and less than 2% oxygen may substantially increase the quality of the pattern enabling removal of residual layer 48 while substantially preserving desired structures. In particular, as shown in FIG. 11, quality of pattern may be substantially retained even after 60 second of exposure within the nitrogen-enriched environment.

Although system 60 is depicted with reservoirs 68a or 68b providing a gas composition to chamber 64, it will be appreciated that there are alternative ways to provide the gas composition between the radiation source and the substrate. For example, reservoirs may be configured to locally deliver the gas composition at that portion of the substrate in alignment with the radiation source so as to provide the gas composition between the radiation source and the substrate.

FIGS. 12-17 illustrate an exemplary nano-patterning process. Generally, polymerizable material 34 may be patterned as described above providing a patterned layer 46 having a residual layer 48 with minimal thickness $t_2$. Residual layer 48 may be removed by VUV processing in a gaseous environment of controlled composition, thereby exposing surface of substrate 12 or hard mark layer 60 depending on design considerations (e.g., whether hard mask layer 60 is used in the design). The surface of substrate 12 or hardmask 60 may be patterned using features 50 and 52 of patterned layer 46. The pattern may then be transferred into substrate 12.

Figure 12:
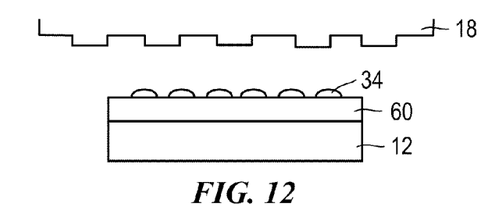
FIGS. 12-17 illustrate simplified side views of an exemplary nano-patterning process in accordance with the present invention.

Referring to FIG. 12, an optional hard mask layer 60 may be positioned on substrate 12. In one embodiment, hard mask layer 60 may be native to substrate 12 (e.g., native oxide on silicon). In another embodiment, hard mask layer 60 may be applied through deposition techniques including, but not limited to, sputtering, chemical vapor deposition, evaporation, and the like. Generally, hard mask layer 60 is thin. For example, hard mask layer 60 may be less than approximately 20 nm. Hard mark layer 60 may be formed of material that exhibits selectivity during subsequent etching steps. For example, hard mask layer 60 may be formed of materials including, but not limited to, thermal oxides (e.g., silicon oxide), metals, and the like. It should be noted that an adhesion layer may be applied to hard mask layer 60. Exemplary adhesion layers are further described in U.S. Ser. Nos. 11/187,407, 11/187,406 and 11/734,542, all of which are hereby incorporated by reference in their entirety. Adhesion layer may provide increased adhesion between hard mask layer 60 and patterned layer 46.

Figure 13:
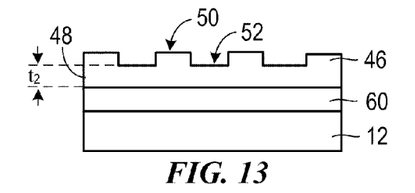

Referring to FIGS. 12 and 13, polymerizable material 34 may be deposited on hard mask layer 60 and patterned using template 18 forming patterned layer 46 using system and processes described in relation to FIGS. 1 and 2. Template 18 may be adapted for large area imprinting (e.g., greater than approximately 6" in width). In one embodiment, features 24 and 26 of template 18 may be pillar-type features. It should be noted that during pattern transfer the use of template 18 having pillar-type features may result in patterns transferred within substrate 12 having features other than pillar-type features. However, such irregularities, as further described herein, may result in increased light diffraction and improve capture efficiency. By selection of pattern of template 18, materials of substrate 12 and/or hardmask layer 60, and etch chemistry, a variety of structures may be transferred and/or created in substrate 12.

Figure 14:
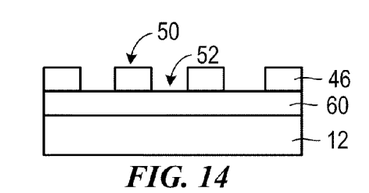

Referring to FIGS. 13 and 14, residual layer 48 may be removed to expose hard mask layer 60 or surface of substrate 12, using the vacuum ultraviolet (VUV) systems and methods previously described herein. Such systems and methods may provide anisotropic or directional etching and may process larger areas and/or multiple substrates 12 further lowering processing costs. Such systems and methods may be particularly suited for photovoltaic devices, which as previously mentioned are highly sensitive to cost, and which also may be more tolerant to pattern defects and or degradation which may result from overexposure to VUV radiation than other nano-patterning applications. While less preferred, residual layer 48 may also be removed using techniques including, but not limited to, batch processing such as oxygen ashers, resist strippers, UV ozone sources, and the like. For example, residual layer 48 may be removed using an oxygen asher (120 W, 25 sccm $O_2$, 60 seconds).

Figure 15:
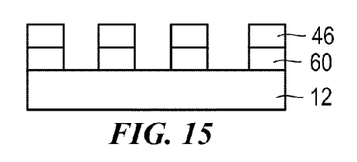

Referring to FIGS. 14 and 15, surface of substrate 12 or hard mask layer 60 may be patterned. For example, hard mask layer 60 may be patterned using a batch process step (e.g., wet chemical exposure), including, but not limited to, hydrofluoric acid (buffered oxide etch) for removal of silicon oxide, ceric ammonium nitrate for patterning chromium, and the like. In one embodiment, hard mask layer 60 is processed using a buffered oxide etchant with a concentration of 6:1:2 ($NH_4F$/HF/DIW) and 20° C. for 15"-20" depending on thickness of hard mask layer 60 (target approximately 10 nm).

Figure 16:
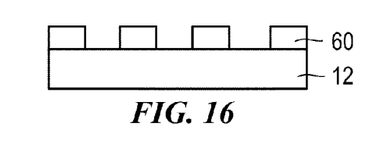

Referring to FIGS. 15 and 16, patterned layer 46 may be removed through techniques including, but not limited to, sonication, megasonic rinsing, and the like. In one embodiment, patterned layer 46 is removed through quick dump DI water rinsing and approximately 10 minutes of ultrasonic DI water rinsing.

Figure 17:
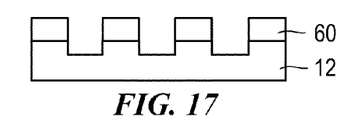

Following removal of patterned layer 46, the pattern provided by remaining hard mask layer 60 may be transferred to substrate 12 as illustrated in FIG. 17. This pattern may be transferred into substrate 12 using wet chemical exposure wherein the chemistry is selective towards the bulk material of substrate 12. For example, potassium hydroxide may be used in etching of silicon where hard mask layer 60 is formed of silicon oxide (e.g., 45% KOH solution at 50° C. for approximately 45").

Figure 18:
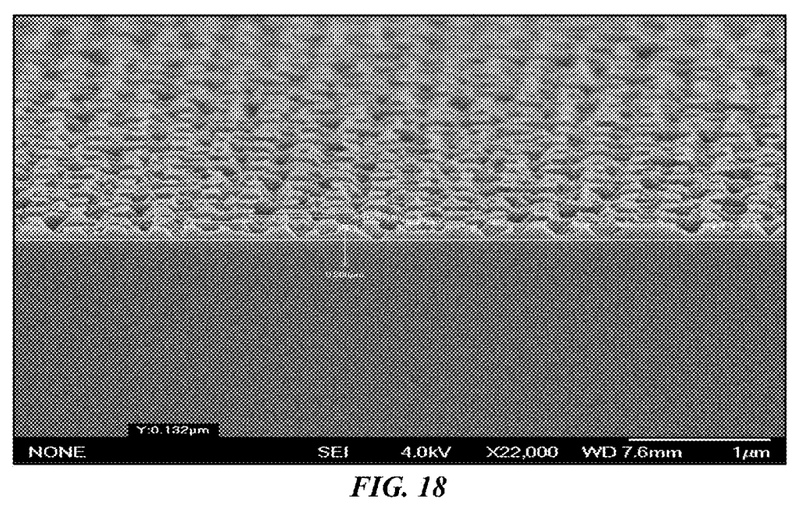
FIGS. 18-23 are black and white micrographs of resulting structures formed by the nano-patterning process of FIGS. 12-17.

Alteration in the methods described above may alter feature formation. For example, FIG. 18 illustrates a transferred pillar pattern that includes irregular, random etching in areas between pillars. This irregularity results from incomplete oxide removal prior to wet chemical exposure shown in FIGS. 16 and 17. The resulting structures, however, provide increased light diffraction and improved capture effects providing for increased solar efficiency.

Figure 19:
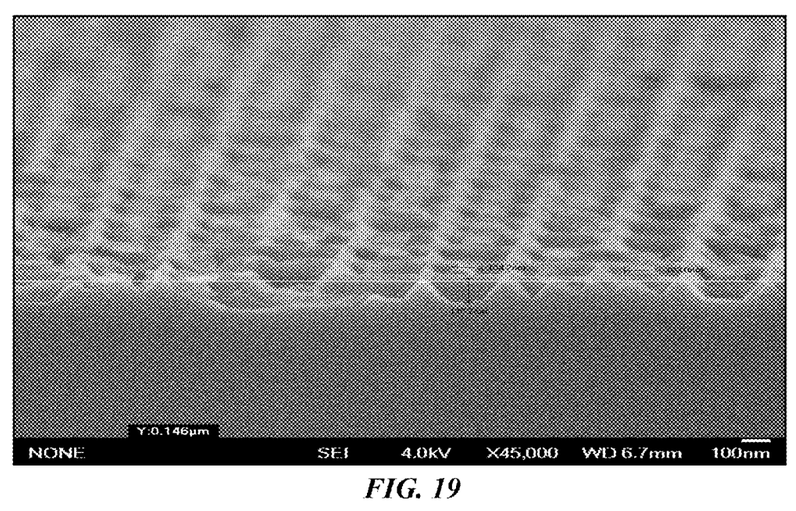
Figure 20:
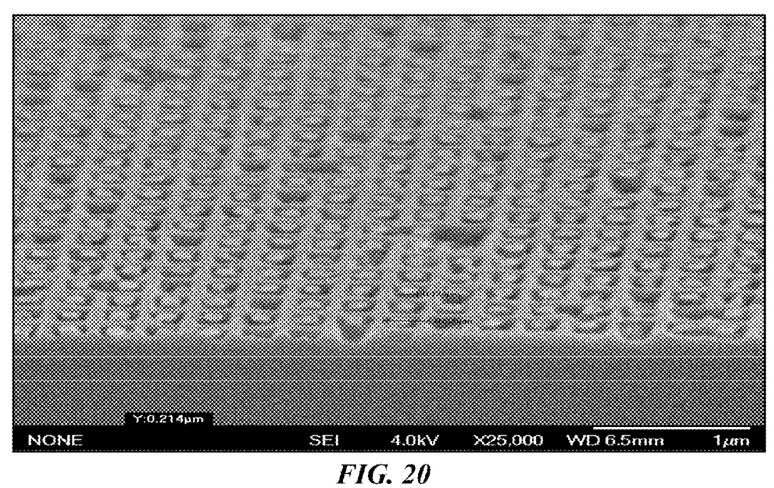
Figure 21:
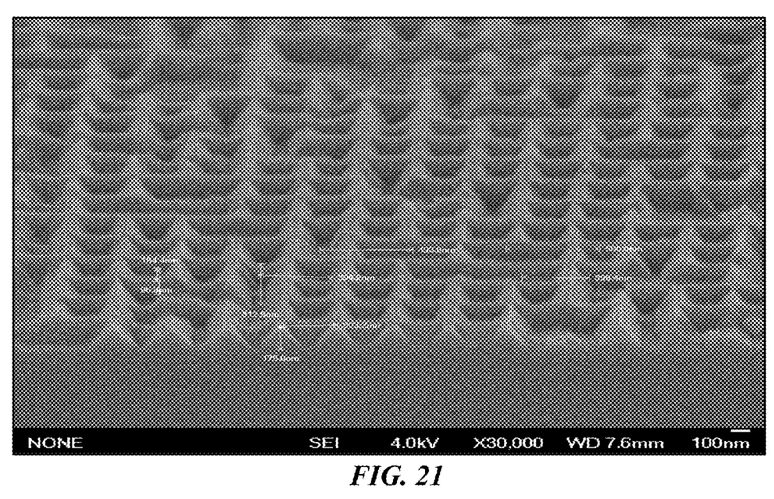

FIG. 19 illustrates a transferred pillar pattern including pyramid structures. Formation of pyramid structures results from using a very light residual layer 48 removal process such that a thin residual layer 48 adjacent to pillars may be removed while a thin residual layer 48 between pillars remains intact prior to removal of hard mask layer 60 as illustrated in FIG. 20. The pyramid structure may be further modified by increasing the time substrate 12 may be exposed to wet etch chemistry (e.g., KOH). By increasing the time to remove center portion of remaining residual layer 48 between pillars, structures shown in FIG. 21 may be formed. For example, by using substrate 12 of <100> silicon, showing selective etching of the 100 crystal plane to the 111 crystal plane, these structures may be formed.

Figure 22:
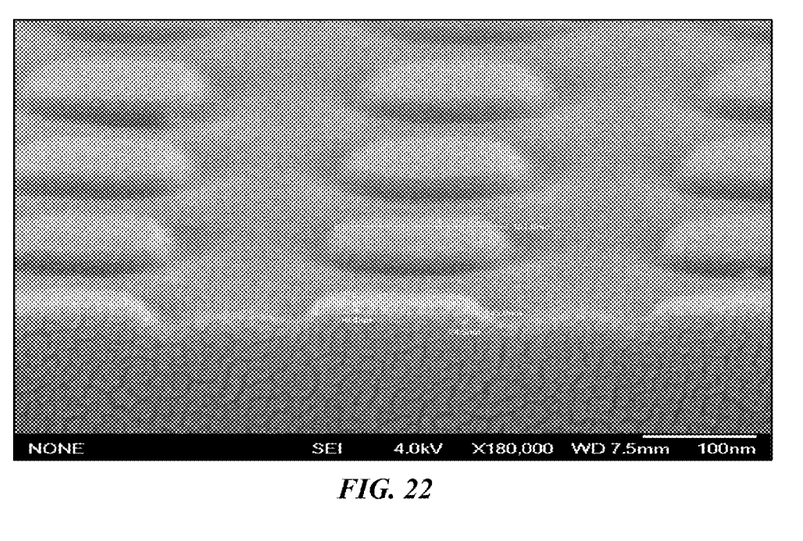
Figure 23:
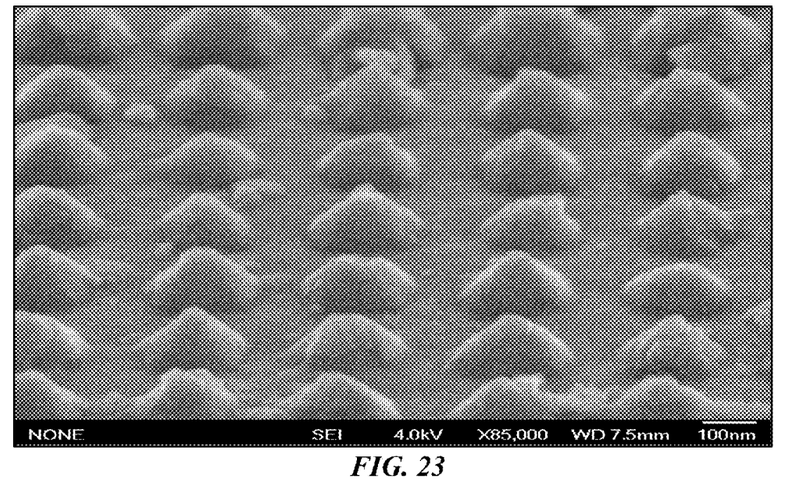

Alternative to the process described in relation to FIGS. 12-21, hardmask layer 60 may be defined by another technique (e.g., RIE). For example, an oxygen ash descum process may be followed by a $CF_4/O_2$ RIE to define hardmask layer 60. FIG. 22, illustrates exemplary dry etched oxide bumps formed on substrate 12 using such processes. Substrate 12 may then be carried through additional wet etching solution in order to pattern surface of substrate 12. For example, following wet etching (e.g., KOH), nano-pyramid structures may be formed as shown in FIG. 23.

What is claimed is:

1. A method for removing solidified polymerizable material on a substrate, comprising the steps of:
   (a) forming a patterned layer, said patterned layer having pattern features and a residual layer on a at least portion of the substrate;
   (b) providing a vacuum ultraviolet (VUV) radiation source;
   (c) positioning said substrate such that said portion of said substrate having a residual layer is in alignment with said vacuum ultraviolet (VUV) radiation source; and
   (d) providing a gas composition of less than 10% oxygen between said portion of said substrate and said vacuum ultraviolet (VUV) radiation source;
   (e) irradiating said substrate while in the presence of said gas composition with vacuum ultraviolet (VUV) radiation to remove said residual layer from said portion of said substrate while preserving said patterned features.

2. The method of claim 1 wherein said provided vacuum ultraviolet (VUV) radiation source is enclosed within a chamber, said chamber having an exposure aperture, and wherein said substrate positioning step further comprises positioning said substrate portion in alignment with said exposure aperture.

3. The method of claim 2 further comprising providing said gas composition to said chamber.

4. The method of claim 1 wherein said vacuum ultraviolet (VUV) radiation is provided at a wavelength of between 140 to 190 nm.

5. The method of claim 1 wherein said vacuum ultraviolet (VUV) radiation is provided at a peak intensity of approximately 172 nm and a spectral bandwidth of approximately 15 nm FWHM.

6. The method of claim 1 wherein said provided gas composition contains less than 5% oxygen.

7. A method for transferring a pattern on a hard mask layer or a substrate, comprising the steps of:
   (a) forming a hard mask on a substrate;
   (b) forming a patterned layer, said patterned layer having pattern features and a residual layer on a at least a portion of said hard mask;
   (c) providing a vacuum ultraviolet (VUV) radiation source;
   (d) positioning said substrate such that said portion of said hard mask having a residual layer is in alignment with said vacuum ultraviolet (VUV) radiation source;
   (e) providing an gas composition of less than 10% oxygen between said portion of said hard mask and said vacuum ultraviolet (VUV) radiation source;
   (f) irradiating said substrate while in the presence of said gas composition with vacuum ultraviolet (VUV) radiation to remove said residual layer from said portion of said hard mask while preserving said pattern features; and
   (e) transferring said pattern to said hard mask using a batch process step to remove portions of said hard mask.

8. The method of claim 7 wherein said provided vacuum ultraviolet (VUV) radiation source is enclosed within a chamber, said chamber having an exposure aperture, and wherein said substrate positioning step further comprises positioning said hard mask portion in alignment with said exposure aperture.

9. The method of claim 8 further comprising providing said gas composition to said chamber.

10. The method of claim 7 wherein said vacuum ultraviolet (VUV) radiation is provided at a wavelength of between 140 to 190 nm.

11. The method of claim 7 wherein said vacuum ultraviolet (VUV) radiation is provided at a peak intensity of approximately 172 nm and a spectral bandwidth of approximately 15 nm FWHM.

12. The method of claim 7 wherein said provided inert gas composition contains less than 5% oxygen.

13. The method of claim 7 wherein said batch process step uses hydrofluoric acid.

14. The method of claim 7 further comprising the step of removing the patterned layer.

15. The method of claim 14 further comprising transferring said pattern to said substrate by using a batch process step to remove portions of said substrate.

16. The method of claim 15 wherein the batch process step selectively etches the substrate.

17. The method of claim 16 wherein the substrate is silicon, the hard mask is silicon oxide, and potassium hydroxide is used in the batch processing step.

18. A method for removing solidified polymerizable material on a substrate, comprising the steps of:
   (a) forming a patterned layer, said patterned layer having pattern features and a residual layer on a at least portion of the substrate;
   (b) providing a vacuum ultraviolet (VUV) radiation source;
   (c) positioning said substrate such that said portion of said substrate having a residual layer is in alignment with said vacuum ultraviolet (VUV) radiation source; and
   (d) providing a nitrogen-enriched environment of less than 2% oxygen between said portion of said substrate and said vacuum ultraviolet (VUV) radiation source;
   (e) irradiating said substrate while in the presence of said nitrogen-enriched environment with vacuum ultraviolet (VUV) radiation to remove said residual layer from said portion of said substrate while preserving said pattern features.

19. The method of claim 18 wherein said provided vacuum ultraviolet (VUV) radiation source is enclosed within a chamber, said chamber having an exposure aperture, and wherein said substrate positioning step further comprises positioning said substrate portion in alignment with said exposure aperture.

20. The method of claim 19 further Comprising providing said nitrogen-enriched environment to said chamber.

21. The method of claim 18 wherein said vacuum ultraviolet (VUV) radiation is provided at a wavelength of between 140 to 190 nm.

22. The method of claim 18 wherein said vacuum ultraviolet (VUV) radiation is provided at a peak intensity of approximately 172 nm and a spectral bandwidth of approximately 15 nm FWHM.

* * * * *